(12) United States Patent
Gertiser et al.

(10) Patent No.: US 7,808,788 B2
(45) Date of Patent: Oct. 5, 2010

(54) MULTI-LAYER ELECTRICALLY ISOLATED THERMAL CONDUCTION STRUCTURE FOR A CIRCUIT BOARD ASSEMBLY

(75) Inventors: Kevin M. Gertiser, Carmel, IN (US); Richard A. Ripple, Westfield, IN (US); Michael J. Lowry, Indianapolis, IN (US); Karl A. Schten, Kokomo, IN (US); Ronald M. Shearer, Kokomo, IN (US); Jim M. Spall, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 200 days.

(21) Appl. No.: 11/824,019

(22) Filed: Jun. 29, 2007

(65) Prior Publication Data

US 2009/0002950 A1 Jan. 1, 2009

(51) Int. Cl.
*H05K 7/20* (2006.01)
*H01L 23/34* (2006.01)
*H01L 23/495* (2006.01)
*F28F 7/00* (2006.01)

(52) U.S. Cl. .................. 361/709; 361/713; 361/704; 361/719; 165/80.2; 257/675; 257/713

(58) Field of Classification Search .......... 361/709, 361/704, 713, 719; 165/80.2; 257/675, 713
See application file for complete search history.

(56) References Cited

U.S. PATENT DOCUMENTS

| | | | | |
|---|---|---|---|---|
| 4,628,407 A | * | 12/1986 | August et al. | 361/711 |
| 4,729,061 A | * | 3/1988 | Brown | 361/719 |
| 4,731,701 A | * | 3/1988 | Kuo et al. | 361/712 |
| 4,739,448 A | * | 4/1988 | Rowe et al. | 361/719 |
| 4,810,563 A | * | 3/1989 | DeGree et al. | 428/209 |
| 4,964,019 A | * | 10/1990 | Belanger, Jr. | 361/764 |
| 5,045,642 A | * | 9/1991 | Ohta et al. | 174/266 |
| 5,258,887 A | * | 11/1993 | Fortune | 361/720 |
| 5,352,926 A | * | 10/1994 | Andrews | 257/717 |
| 5,371,653 A | * | 12/1994 | Kametani et al. | 361/721 |
| 5,386,339 A | * | 1/1995 | Polinski, Sr. | 361/719 |
| 5,467,251 A | * | 11/1995 | Katchmar | 361/719 |

(Continued)

FOREIGN PATENT DOCUMENTS

DE  43 35 946  4/1995

(Continued)

OTHER PUBLICATIONS

International Search Report dated Oct. 2, 2008.

*Primary Examiner*—Jayprakash N Gandhi
*Assistant Examiner*—Bradley H Thomas
(74) *Attorney, Agent, or Firm*—Jimmy L. Funke

(57) ABSTRACT

A thermal conduction structure is integrated into a multi-layer circuit board to thermally couple a power electronic device to a heatsink while electrically isolating the power electronic device from the heatsink. The thermal conduction structure includes a stack of alternatingly insulative and conductive layers, a first set of vertical vias that thermally and electrically join the power electronic device to a first set of conductive layers, and a second set of vertical vias that thermally and electrically join the heatsink to a second set of conductive layers that are interleaved with the first set of conductive layers.

5 Claims, 2 Drawing Sheets

U.S. PATENT DOCUMENTS

| | | | | |
|---|---|---|---|---|
| 5,506,755 A | * | 4/1996 | Miyagi et al. | 361/720 |
| 5,590,030 A | * | 12/1996 | Kametani et al. | 361/794 |
| 5,615,087 A | * | 3/1997 | Wieloch | 361/719 |
| 5,616,888 A | * | 4/1997 | McLaughlin et al. | 174/260 |
| 5,625,227 A | * | 4/1997 | Estes et al. | 257/712 |
| 5,646,373 A | * | 7/1997 | Collins et al. | 174/252 |
| 5,708,566 A | * | 1/1998 | Hunninghaus et al. | 361/704 |
| 5,721,454 A | * | 2/1998 | Palmer | 257/700 |
| 5,923,084 A | * | 7/1999 | Inoue et al. | 257/712 |
| 6,029,343 A | * | 2/2000 | Wieloch | 29/830 |
| 6,031,723 A | * | 2/2000 | Wieloch | 361/719 |
| 6,058,013 A | * | 5/2000 | Christopher et al. | 361/704 |
| 6,137,064 A | * | 10/2000 | Kiani et al. | 174/266 |
| 6,200,407 B1 | * | 3/2001 | Wieloch et al. | 156/252 |
| 6,201,701 B1 | * | 3/2001 | Linden et al. | 361/720 |
| 6,205,028 B1 | * | 3/2001 | Matsumura | 361/720 |
| 6,282,094 B1 | * | 8/2001 | Lo et al. | 361/704 |
| 6,477,054 B1 | * | 11/2002 | Hagerup | 361/720 |
| 6,521,842 B2 | * | 2/2003 | Brinthaupt et al. | 174/252 |
| 6,696,643 B2 | * | 2/2004 | Takano | 174/520 |
| 6,697,257 B1 | * | 2/2004 | Wolf et al. | 361/708 |
| 6,816,377 B2 | * | 11/2004 | Itabashi et al. | 361/704 |
| 6,829,823 B2 | * | 12/2004 | Downes et al. | 29/852 |
| 6,921,972 B1 | * | 7/2005 | Hashemi | 257/707 |
| 6,930,885 B2 | * | 8/2005 | Barcley | 361/719 |
| 7,024,764 B2 | * | 4/2006 | Kresge et al. | 29/840 |
| 7,031,165 B2 | * | 4/2006 | Itabashi et al. | 361/719 |
| 7,057,891 B2 | * | 6/2006 | Ito et al. | 361/679.46 |
| 7,138,711 B2 | * | 11/2006 | Yee et al. | 257/720 |
| 7,586,191 B2 | * | 9/2009 | Hall et al. | 257/720 |
| 2002/0029875 A1 | * | 3/2002 | Takano | 165/185 |
| 2002/0084524 A1 | * | 7/2002 | Roh et al. | 257/738 |
| 2004/0037044 A1 | * | 2/2004 | Cook et al. | 361/719 |
| 2004/0233642 A1 | * | 11/2004 | Ito et al. | 361/720 |
| 2006/0109632 A1 | * | 5/2006 | Berlin et al. | 361/719 |
| 2006/0209517 A1 | * | 9/2006 | Yui | 361/719 |
| 2006/0220227 A1 | * | 10/2006 | Marro | 257/723 |

FOREIGN PATENT DOCUMENTS

| | | |
|---|---|---|
| GB | 1 220 370 | 1/1971 |
| WO | 99/57951 | 11/1999 |

* cited by examiner

MULTI-LAYER ELECTRICALLY ISOLATED THERMAL CONDUCTION STRUCTURE FOR A CIRCUIT BOARD ASSEMBLY

TECHNICAL FIELD

The present invention relates to an electronic circuit board assembly including a power electronic device mounted on a multi-layer circuit board, and more particularly to an electrically isolated thermal conduction structure integrated into the multi-layer circuit board for dissipating heat generated by the power electronic device.

BACKGROUND OF THE INVENTION

Various thermal conduction structures have been used to dissipate heat generated by the power electronic devices of electronic circuit board assemblies. A common approach is to attach a heatsink to the circuit board substrate opposite the power electronic devices, and to incorporate thermal vias into the circuit board for thermally coupling the power devices to the heatsink. While the thermal via approach can be effectively used in certain applications, it is frequently necessary to electrically isolate the power electronic devices from the heatsink by depositing a layer of special insulating material between the circuit board and the heatsink. This not only increases the cost of the circuit board assembly, but also reduces thermal coupling of the circuit board to the heatsink. Accordingly, what is needed is a circuit board having an electrically isolated thermal conduction structure that is inexpensive to manufacture and that provides improved thermal coupling.

SUMMARY OF THE INVENTION

The present invention is directed to an improved thermal conduction structure integrated into a multi-layer circuit board for thermally coupling a power electronic device to a heatsink while providing electrical isolation between the power electronic device and the heatsink. The thermal conduction structure includes a stack of alternatingly insulative and conductive layers, a first set of vertical vias that thermally and electrically join the power electronic device to a first set of conductive layers, and a second set of vertical vias that thermally and electrically join the heatsink to a second set of conductive layers that are interleaved with the first set of conductive layers.

DESCRIPTION OF THE PREFERRED EMBODIMENT

In general, the present invention is directed to a multi-layer thermal conduction structure designed into a multi-layer circuit board or substrate. A power electronic device is mounted on one side of the thermal conduction structure, and a heatsink is affixed to the other side of the thermal conduction structure. The purpose of the thermal conduction structure is to thermally couple the power electronic device to the heatsink while electrically isolating the power electronic device from the heatsink. The thermal conduction structure is illustrated in the context of a multi-layer woven glass (FR4) circuit board, but it will be appreciated that the structure could alternately be implemented in a multi-layer ceramic circuit board.

Figure 1A:
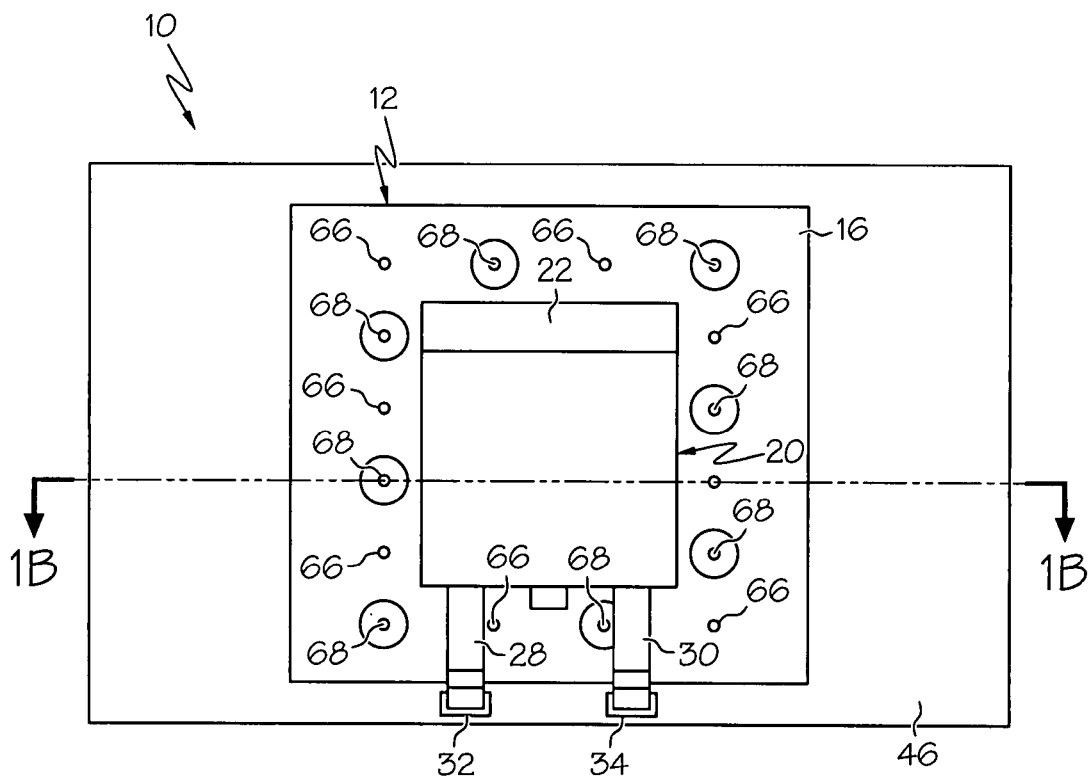
FIG. 1A is a top view of an electronic circuit board assembly including a power electronic device and a multi-layer circuit board incorporating a thermal conduction structure according to this invention.
Figure 1B:
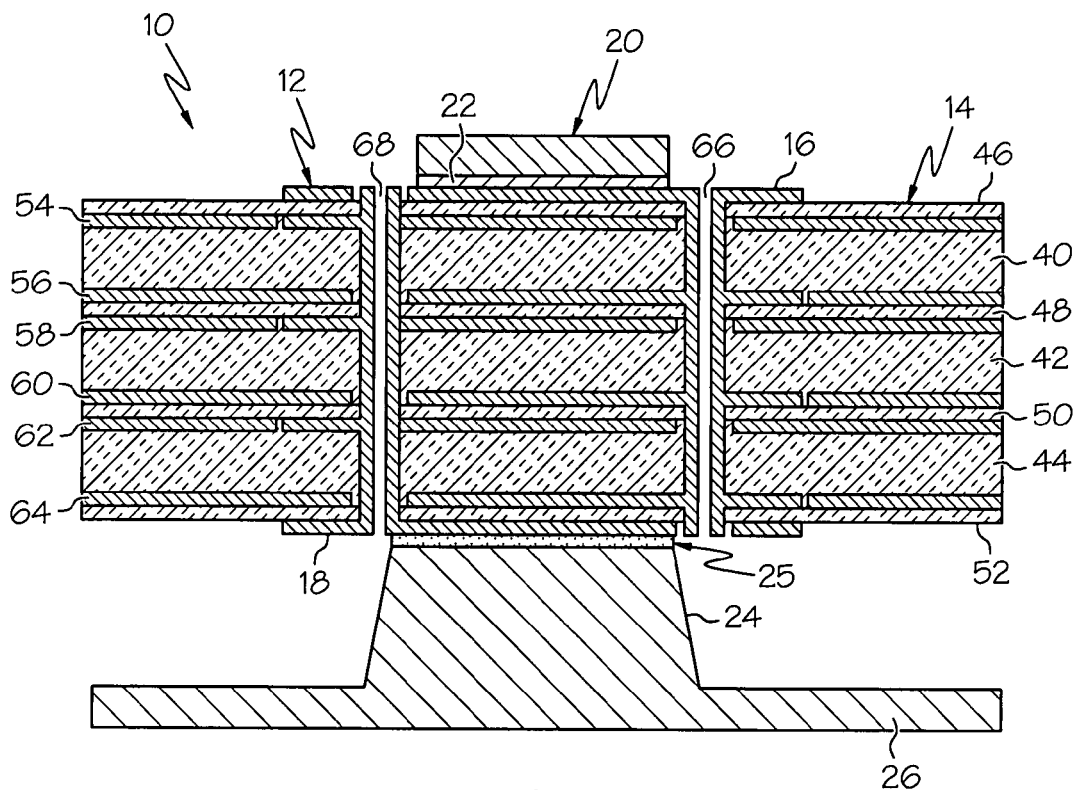
FIG. 1B is a cross-sectional view of the an electronic circuit board assembly of FIG. 1A taken along lines 1B-1B of FIG. 1A.

Referring to FIGS. 1A-1B, the reference numeral 10 generally designates an electronic circuit board assembly incorporating a multi-layer thermal conduction structure 12 according to this invention. Thermal conduction structure 12 is designed into a multi-layer circuit board 14 (also referred to herein as a substrate) of conventional construction, resulting in exposed upper and lower copper pads 16 and 18. A power electronic device 20 having an exposed metal base 22 is soldered or otherwise thermally affixed to a central region of the upper copper pad 16, and the pedestal 24 of a metal heatsink 26 is soldered or otherwise thermally affixed to a central region the lower copper pad 18 opposite the device 20. For example, a thin layer 25 of solder may be used to provide a high thermal conductivity joint between copper pad 18 and pedestal 24. In the illustration, the metal base 22 forms one terminal of the device 20, and the other terminals 28 and 30 of device 20 extend beyond the perimeter of thermal conduction structure 12 where they are soldered to respective pads 32 and 34.

As depicted in the cross-sectional view of FIG. 1B, the thermal conduction structure 12 comprises a number of alternatingly insulative and conductive layers between the upper and lower copper pads 16 and 18 that insulate upper copper pad 16 from lower copper pad 18 while providing thermal conduction between adjacent layers to transfer heat dissipated by the device 20 to the metal pedestal 24. The reference numerals 40-52 designate the insulative layers, while the reference numerals 54-64 designate the conductive layers. Insulative layers 40-44 (also referred to herein as core layers) and conductive layers 54-64 are defined by a three-sheet stack of copper-clad epoxy-impregnated woven glass circuit board material such as FR4. That is, conductive layers 54 and 56 are bonded to opposing faces of the top core layer 40; conductive layers 58 and 60 are bonded to opposing faces of the middle core layer 42; and conductive layers 62 and 64 are bonded to opposing faces of the bottom core layer 44. Typically, the core layers 40-44 will each have a thickness of 0.010 inch, for example, and the copper layers 54-64 will each have a thickness of 0.0028 inch, for example. The insulative layers 46-52, also referred to herein as thermal bridge layers, electrically isolate adjacent conductive layers 16, 54-64 and 18. Specifically, thermal bridge layer 46 is disposed between upper copper pad 16 and conductive layer 54; thermal bridge layer 48 is disposed between conductive layers 56 and 58; thermal bridge layer 50 is disposed between conductive layers 60 and 62; and thermal bridge layer 52 is disposed between conductive layer 64 and lower copper pad 18. The thermal bridge layers 46-52 are preferably formed of pre-impregnated woven glass material (i.e., pre-preg FR4) having a thickness of 0.003 inch, for example, and serve as a thermal bridge between respective adjacent conductive layers.

Thermal conduction structure 12 additionally includes an array of copper-lined vias 66 and 68 that are located in a marginal area beyond the footprint of the device 20, and that extend vertically through the entire structure. The vias 66 are joined to the upper copper pad 16 and conductive layers 56, 60 and 64, but are separated from the lower copper pad 18 and conductive layers 54, 58 and 62. On the other hand, the vias 68 are separated from upper copper pad 16 and conductive layers 56, 60 and 64, but are joined to lower copper pad 18 and conductive layers 54, 58 and 62. This preserves the electrical isolation between upper and lower pads 16 and 18, while providing vertical thermal conduction paths between alternating conductive layers.

Figure 2:
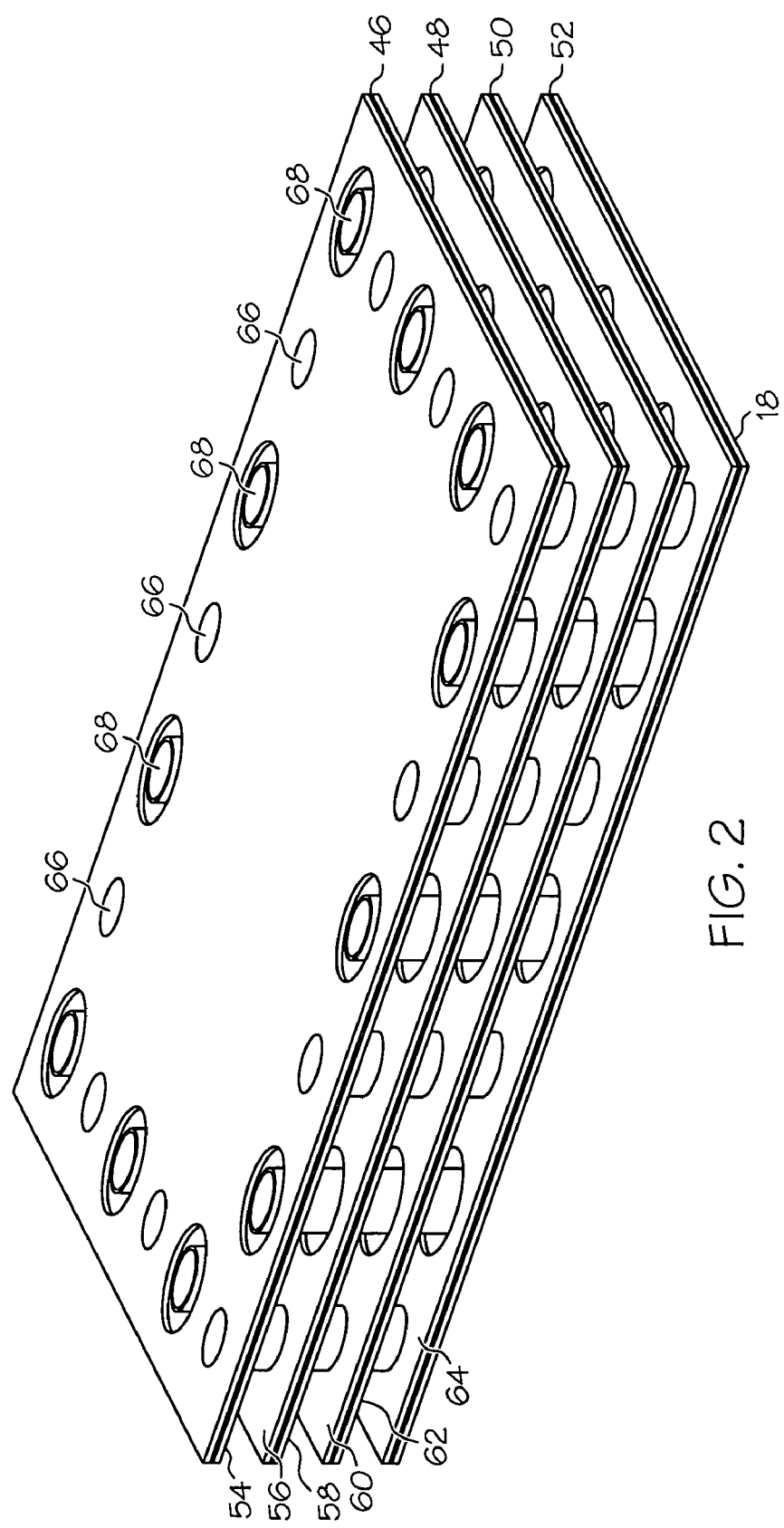
FIG. 2 is an isometric illustration of a thermal conduction structure according to this invention, with core insulative layers of the structure removed to reveal the thermal conduction paths.

It will be appreciated that the above-described thermal conduction structure 12 can be designed into (and replicated in) a multi-layer circuit board using conventional circuit board manufacturing techniques such as photo-etching the copper layers bonded to core layers 40-44, drilling vertically through the layered assembly to locate the vias 66-68, and copper-plating the drilled openings to form the vias 66-68. For example, the conductive layers 54, 58, 62 and 18 are circularly etched to ensure that they remain electrically isolated from the vias 66. Similarly, the conductive layers 16, 56, 60 and 64 are circularly etched to ensure that they remain electrically isolated from the vias 68, as seen in the illustration of FIG. 2 where the core layers 40-44 have been omitted to reveal the primary thermal conduction paths between upper and lower pads 16 and 18.

In summary, the thermal conduction structure 12 of present invention provides a reliable and cost-effective way of transferring heat from a power electronic device to a heatsink while electrically isolating the power electronic device from the heatsink. Heat applied to upper pad 16 by the device 20 is successively transferred to the intermediate copper layers 54-64 and 18 through the thin insulative thermal bridge layers 46-52 and the vias 66-68, and is then transferred to the metal pedestal 24 through the solder or conductive adhesive layer 25 joining lower pad 18 to heatsink 26. Testing has indicated that the described thermal conduction structure 12 thermally outperforms known via structures, while avoiding the expense associated with providing a special insulative interface between the circuit board and the heatsink.

While the invention has been described with respect to the illustrated embodiment, it is recognized that numerous modifications and variations in addition to those mentioned herein will occur to those skilled in the art. For example, the shape, thickness, number of layers and material composition may be different than shown herein, one or more blind vias may be included in the structure, and so on. Accordingly, it is intended that the invention not be limited to the disclosed embodiment, but that it have the full scope permitted by the language of the following claims.

The invention claimed is:

1. An electronic circuit board assembly, comprising:
a multi-layer thermal conduction structure including first and second stacks of conductive layers, the conductive layers of said second stack being interleaved with but electrically insulated from the conductive layers of said first stack such that an exposed conductive layer of said first stack forms a top surface of said thermal conduction structure and an exposed conductive layer of said second stack forms a bottom surface of said thermal conduction structure;

first and second sets of conductive vias, said first set of conductive vias being electrically joined to said top surface and the conductive layers of said first stack but electrically isolated from said bottom surface and the conductive layers of said second stack, and said second set of conductive vias being electrically joined to said bottom surface and the conductive layers of said second stack but electrically isolated from said top surface and the conductive layers of said first stack, thereby providing vertical thermal conduction paths through said thermal conduction structure while preserving electrical insulation between said top surface and said bottom surface;

a power electronic device having an exposed metal base that is thermally affixed to the top surface of said thermal conduction structure; and a heatsink that is thermally affixed to the bottom surface of said thermal conduction structure opposite said power electronic device so that the exposed metal base of said power electronic device is thermally coupled to the heatsink through the first and second stacks of interleaved conductive layers and the first and second sets of conductive vias, and yet electrically insulated from the heatsink.

2. The electronic circuit board assembly of claim 1, where:
said first and second sets of conductive vias are located in a marginal area laterally beyond a footprint of said power electronic device.

3. The electronic circuit board assembly of claim 1, where:
said first and second stacks of conductive layers are designed into a multi-layer circuit board.

4. The electronic circuit board assembly of claim 1, further comprising:
a stack of electrically insulative thermal bridge layers disposed between adjacently disposed conductive layers of said first and second stacks.

5. The electronic circuit board assembly of claim 4, where:
said thermal bridge layers are formed of pre-impregnated woven glass material, each such layer having a thickness of approximately 0.003-0.004 inch.

\* \* \* \* \*